United States Patent

[11] 3,630,793

[72] Inventors Ralph W. Christensen
Butler;
Everett C. Smith, Sarver, both of Pa.;
George Tibol, Fairview, N.J.
[21] Appl. No. 801,667
[22] Filed Feb. 24, 1969
[45] Patented Dec. 28, 1971
[73] Assignees Solitron Devices, Inc.
Tappan, N.Y.;
Semi-Elements, Inc.
Saxonburg, Pa., part interest to each

[54] METHOD OF MAKING JUNCTION-TYPE SEMICONDUCTOR DEVICES
4 Claims, 1 Drawing Fig.

[52] U.S. Cl. .................... 148/188, 148/186
[51] Int. Cl. .................... H01l 7/44
[50] Field of Search .................... 148/187, 188

[56] References Cited

UNITED STATES PATENTS

| | | | |
|---|---|---|---|
| 3,055,776 | 9/1962 | Stevenson et al. | 148/189 |
| 3,084,079 | 4/1963 | Harrington | 148/188 |
| 3,354,005 | 11/1967 | Lepiane et al. | 148/186 |
| 3,464,868 | 9/1969 | Edwards et al. | 148/188 |

*Primary Examiner*—Hyland Bizot
*Attorney*—Bernard Malina

ABSTRACT: This patent discloses a method for making junction-type semiconductor devices in which dopant is introduced into a wafer from a prefabricated source film.

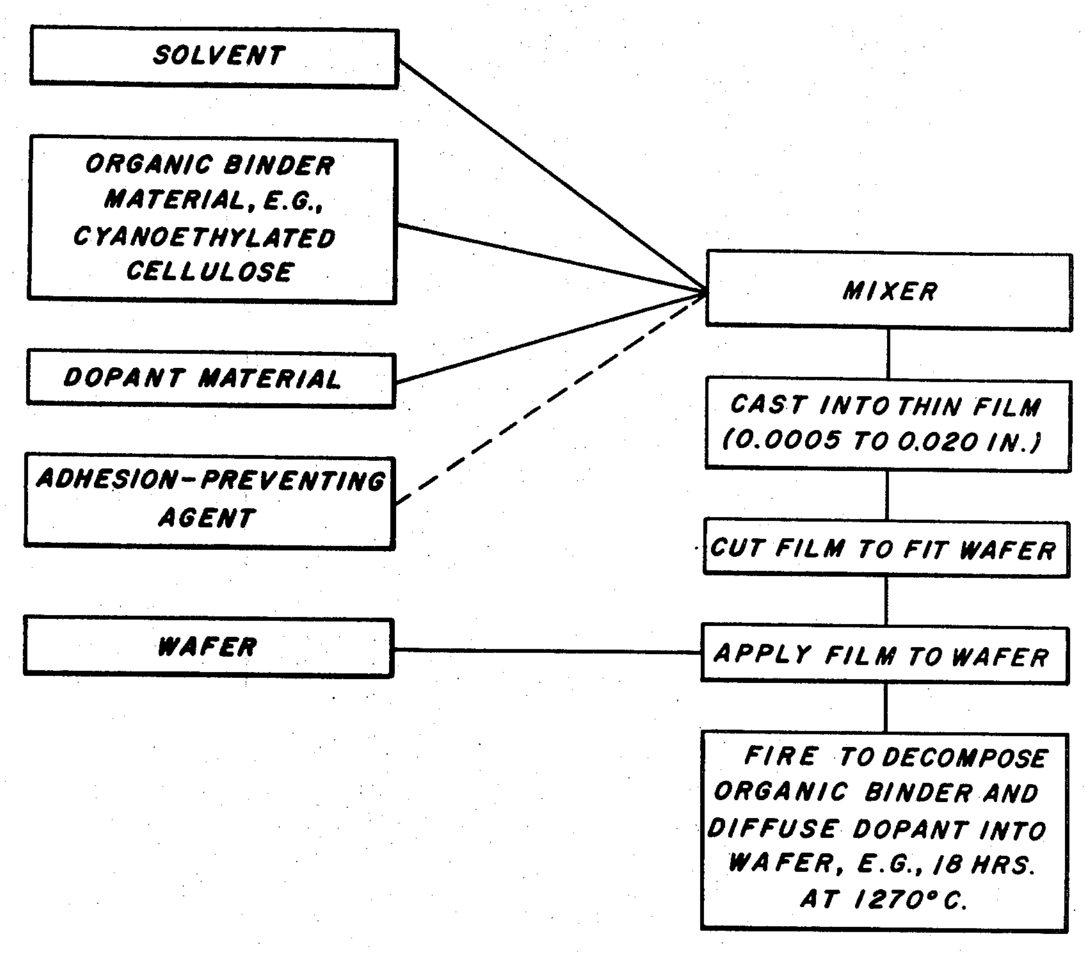
INVENTORS.
RALPH W. CHRISTENSEN
EVERETT C. SMITH
GEORGE TIBOL
BY
Murray & Lukhauer
ATTORNEYS

METHOD OF MAKING JUNCTION-TYPE SEMICONDUCTOR DEVICES

BACKGROUND OF THE INVENTION

1. Field of the Invention

This invention relates to making junction-type semiconductor devices.

2. Description of the Prior Art

Methods are known for making junction-type semiconductor devices (transistors, diodes, etc.) that involve the introduction, into a suitable wafer material such as silicon, germanium, gallium arsenide, gallium phosphide, indium antimonide, or silicon-germanium alloy, of a controlled, small quantity of a dopant material. There are known N-type dopant materials, such as phosphorus pentoxide or arsenic, antimony, iron, or cobalt. There are known P-type dopant materials, such as boron nitride, boric acid, indium, methyl borate, and gallium.

In the early days of the making of such devices, the dopant was usually introduced onto or into the wafer by using either an epitaxial-growth process that involves desposition of vaporized wafer material containing a relatively small number of atoms of dopant material, or a gas-phase diffusion process. Such procedures are, of course, both time consuming and costly.

Somewhat more recently, there has been developed the practice of mixing a dopant material with an organic binder to form a slurry and then painting the slurry onto the surface of the wafer, which is then heated in a furnace to permit the dopant to diffuse into the wafer. The hand-painting step is tedious, and it sometimes results in nonuniformity of the distribution of the dopant within the wafer after the diffusion step. When this happens, the quality of the junction obtained is adversely affected, sometimes to the extent that the treated wafer must be discarded.

BRIEF SUMMARY OF THE INVENTION

In accordance with the invention, a junction-type semiconductor device is made by applying to a wafer a prefabricated film that serves as a source of dopant. The prefabricated film is made by slip casting or doctor-blading of an appropriate mixture that comprises dopant material, organic binder material, solvent and, if desired or needed, an agent for preventing adherence of one wafer to another in the event that wafers are fired in stacks.

DESCRIPTION OF THE DRAWINGS

A complete understanding of the invention may be had from the foregoing and following description thereof, taken together with the appended drawing, in which the sole FIGURE is a flow diagram of the process of the present invention.

DESCRIPTION OF THE PREFERRED EMBODIMENTS

Referring to the FIGURE, the first step in the process of the invention is mixing of a suitable composition for the making of the film.

As solvent, any of several materials may be used, such as acetone, acetonitrile, acrylonitrile, delta-butyrolactone, dimethylformamide, nitromethane, pyridine, tetrahydrofuran, ethyl acetate, or n-butyl acetate. Still others will suggest themselves to persons of ordinary skill in the art. It is desirable, but not essential, that the solvent be of such nature, and be present in such amount, as to form, with the organic binder material used, a homogenous mixture.

With respect to the organic binder material, good results have been obtained with highly cyanoethylated cellulose, such as that sold by American Cyanamid Company under the trademark "CYANOCEL." This material has a nitrogen content of about 12.0 to 12.6 by weight and a degree of polymerization of about 300 to 400. Other suitable binder materials include polyvinyl alcohol, starch, vinyl butyrate, and methyl cellulose. Still other suitable organic binder materials will suggest themselves to persons of ordinary skill in the art, in view of the ones named above.

The dopant is used either in the form of very finely divided metal powder or in the form of a compound of the dopant metal that will suitably decompose, at or below the temperature of firing, to diffuse dopant into the wafer material. Thus, if a portion of a wafer is to be treated with P-type dopant, it is possible to use boron nitride, boric acid, indium, methyl borate or gallium. If a portion of the wafer is to be treated with N-type materials, there may be used as the dopant $P_2O_5$, or arsenic antimony, iron, or cobalt.

In certain instances it may be desirable to deposit a release agent onto the surface against which the dopant film is casted to facilitate its removal from this stratum. However, it usually suffices to wet the film with wafer which due to the porosity of the film permits water penetration and consequent loosening of it from the surface. A number of release agents are commercially available among which may be mentioned the "MS—122 Fluoro Carbon" sold by Miller Stephenson Company and the water soluble general release agent sold by Percy Harms Company under the trademark "slide."

In certain instances, it may also prove advantageous to include in the mixture an adhesion-preventing agent such as alumina. In the final step of the process as here described, wafers are fired in order to cause diffusion of dopant thereinto. It is frequently advantageous to conduct this firing operation with the wafers stacked one upon another. The alumina is used to insure that the wafers can be separated, one from another, after such firing operation. Of course, it is not necessary that the alumina be incorporated in the mixture. If the mixture does not contain alumina, alumina can be interspersed between the wafers comprising the stacks, before the firing operation. This can be done in any of several suitable ways, as will be apparent to those skilled in the art. Moreover, substances other than alumina may be used for this purpose.

Considerable variation is permissible in the proportions used of the above-discussed ingredients. It is necessary, however, that the solvent be present in an amount that will give the mixture suitable handling characteristics. Generally, one or two parts by volume of solids are mixed with one part by volume of the liquid mixture of solvent plus organic binder material. The organic binder material is usually present in an amount of about 3–10, percent by weight, the total weight of other dry solids used (dopant, alumina, etc.). When a substantial amount of alumina is used, the dopant material may comprise only a small percentage, such as about 1–5, of the dry solids used in making the mixture. In other instances, it may be the principal dry ingredient. The alumina may be omitted altogether, or it may comprise about 90–98 by weight of the dry solids in the mixture.

After the above ingredients have been thoroughly blended to produce a homogenous mixture, the mixture is then cast or otherwise formed into a thin film, using slip casting, doctor blading, or a similar technique. In this way, there may be produced a film having such dimensions as 15 inches a greater in width and 0.0005 to 0.02 inch, with the length of the sheet so produced being dependent upon the quantity of material worked with.

The film so produced is then cut into pieces of suitable size and shape for use in doping semiconductor wafers.

Semiconductor wafers may be of any known or suitable type, such as those made of silicon, germanium, silicon-germanium alloys, gallium arsenide, gallium phosphide, indium antimonide, or any of a great number of other compositions that exhibit appropriate semiconducting electrical properties.

The film is applied to the wafer. If the wafers are to be fired in stacks and the film composition does not contain alumina or the like, alumina is provided between filmed wafers as the stacks of film wafers to be fired are being formed.

The final step of the process, namely, the firing of the film wafer to cause diffusion thereinto of dopant material is conducted in the manner that is conventional for the firing of wafers having painted-on dopant coatings; the same equipment, atmospheres, times, and temperatures can be used. This may involve, for example, holding in a nitrogen atmosphere at about 1270° C. for 18 hours.

The practice described above has the advantage, in comparison with the known practice of painting onto the wafers a slurry of dopant material, the nonhomogeneities in the distribution of the dopant material on the surface of the wafer can be avoided or greatly minimized. The application of the film to the wafer is less tedious, and is more susceptible of automation. With the dopant material spread more homogeneously over the surface of the wafer, it is possible that lower furnace operating temperatures and/or shorter furnace times in doped diffusion operation may be used. The yields of suitably doped wafers are improved. The use of dopant films presents the possibility of selectively cutting and positioning the film upon the wafer to form discrete junction areas and shapes without the conventional need of masking.

The invention described above is illustrated by the following specific examples, which are not to be interpreted in a limiting sense:

EXAMPLE I

There is made a junction-type semiconductor device using P-type dopant. First, there is prepared a mixture comprising 50 parts by weight boron nitride, 50 parts by weight alumina, 3 parts by weight cyanoethylated cellulose ("CYANOCEL,") and sufficient solvent (dimethylformamide) to form a slurry of suitable handling characteristics, i.e., about the same volume of solvent as dry solids. This mixture is then cast, using a modified doctor-blade technique, into a flexible film about 0.001 inch thick. To be more precise the above-mentioned mixture is placed upon an endless belt of stainless steel 0.030 inch thick and 16 inches wide and then passed between the belt and a doctor blade, to form a coating of the above-mentioned thickness. Though it is not absolutely necessary, it is helpful to soak with a water spray the film thus formed to aid its release from the belt. If a water spray is used, the film is dried before further processing. The film is cut to appropriate size and is placed upon a wafer of semiconductor material (silicon, about 1 inch diameter by one-fourth inch thick). The filmed wafer is fired to diffuse the dopant into the wafer, this being done by heating to 1,270° C. and holding at that temperature for 18 hours. Early in the firing process, the organic constituents of the film are volatilized. Later, the boron nitride is decomposed and boron enters the wafer as dopant.

Examination of a sample so treated reveals uniform dopant penetration to a depth of 0.0026 inch. The sample shows uniformity of junction depth and good delineation, as well as other characteristics about the same as or better than those of devices formed with the use of the known paint-on technique.

Example II

Example I is repeated, except that the initial mixture comprises 27 grams of boric acid, 900 grams of alumina, 27 grams of cyanoethylated cellulose, and a suitable quantity of solvent, i.e., in this case above twice the volume of the dry solids, or 670 milliliters.

Examination of the same so treated reveals uniform dopant penetration to a depth of 0.003 inch, along with other results as mentioned in example I.

Example III

Example II is repeated, except that instead of there being prepared and fired a single wafer, a stack of six such filmed wafers is prepared and fired. The results are the same as before. Owing to the high alumina content of the film, adjacent fired wafers are easily separated.

While there have been described herein certain embodiments of the invention, it is intended that there be covered as well any change or modification therein that may be made without departing from its spirit and scope.

We claim as our invention:

1. A method of making a junction-type semiconductive device comprising:

a. providing a composition containing a dopant material and an organic binder slurried in an organic solvent;

b. forming said slurry into a self-supporting film having a thickness of about 0.0005 to 0.02 inch c. juxtaposing said film with an undoped wafer of semiconductor material; and d. heating said wafer while said film is in contact therewith to volatilize said organic solvent and binder and effect diffusion of said dopant into said wafer to a substantially uniform depth of penetration.

2. The method of claim 1 wherein the organic binder material is selected from the group consisting of cyanoethylated cellulose, methyl cellulose, polyvinyl alcohol, starch and vinyl butyral.

3. A method as defined in claim 2, characterized in that there is also mixed with said solvent about 90–98, by weight of dry solids present in said mixture, of alumina.

4. A method as defined in claim 3, characterized by the further step of superposing upon a first wafer a second wafer, at least said first wafer being made in accordance with the method of claim 3, conducting said heating with said wafers in touching relationship, and then separating said first and second wafers.

* * * * *